United States Patent [19]

Drewery et al.

[11] Patent Number: 6,080,287

[45] Date of Patent: Jun. 27, 2000

[54] METHOD AND APPARATUS FOR IONIZED PHYSICAL VAPOR DEPOSITION

[75] Inventors: John S. Drewery; Thomas J. Licata, both of Mesa, Ariz.

[73] Assignee: Tokyo Electron Limited, Tokyo, Japan

[21] Appl. No.: 09/073,141

[22] Filed: May 6, 1998

[51] Int. Cl.[7] .................................................. C23C 14/34
[52] U.S. Cl. ................ 204/192.15; 204/192.12; 204/298.21; 204/298.08; 204/298.06; 204/298.11; 204/298.17; 204/298.15; 204/298.16
[58] Field of Search ........................ 204/192.12, 298.21, 204/298.18, 298.08, 298.06, 298.11, 298.17, 298.15, 298.16, 192.15

[56] References Cited

U.S. PATENT DOCUMENTS

| | | | |
|---|---|---|---|
| 4,721,553 | 1/1988 | Saito et al. ........................ | 204/192.12 |
| 4,844,775 | 7/1989 | Keeble . | |
| 4,911,814 | 3/1990 | Matsuoka et al. ..................... | 204/298 |
| 4,948,458 | 8/1990 | Ogle ........................................ | 156/643 |
| 4,990,229 | 2/1991 | Campbell et al. .................. | 204/298.06 |
| 5,069,770 | 12/1991 | Glocker .............................. | 204/192.12 |
| 5,178,739 | 1/1993 | Barnes et al. . | |
| 5,622,635 | 4/1997 | Cuomo et al. . | |
| 5,728,280 | 3/1998 | Scherer ............................. | 204/298.18 |
| 5,800,688 | 9/1998 | Lantsman et al. . | |

FOREIGN PATENT DOCUMENTS

| | | |
|---|---|---|
| 0 593 924 A1 | 4/1994 | European Pat. Off. . |
| 0607797 | 7/1994 | European Pat. Off. . |
| 0 782 172 A2 | 7/1997 | European Pat. Off. . |
| 0801413 | 10/1997 | European Pat. Off. . |
| 0 836 218 A2 | 4/1998 | European Pat. Off. . |
| 0908922 | 4/1999 | European Pat. Off. . |
| 61-190070 | 8/1986 | Japan . |
| WO9848444 | 10/1998 | WIPO . |
| WO9914791 | 3/1999 | WIPO . |

Primary Examiner—Nam Nguyen
Assistant Examiner—Julian A. Mercado
Attorney, Agent, or Firm—Woods, Herron & Evans, L.L.P.

[57] ABSTRACT

Ionized physical vapor deposition (IPVD) is provided by a method of apparatus for sputtering conductive metal coating material from an annular magnetron sputtering target. The sputtered material is ionized in a processing space between the target and a substrate by generating a dense plasma in the space with energy coupled from a coil located outside of the vacuum chamber behind a dielectric window in the chamber wall at the center of the opening in the sputtering target. Faraday type shields physically shield the window to prevent coating material from coating the window, while allowing the inductive coupling of energy from the coil into the processing space. The location of the coil in the plane of the target or behind the target allows the target to wafer spacing to be chosen to optimize film deposition rate and uniformity, and also provides for the advantages of a ring-shaped source without the problems associated with unwanted deposition in the opening at the target center.

27 Claims, 5 Drawing Sheets

METHOD AND APPARATUS FOR IONIZED PHYSICAL VAPOR DEPOSITION

This invention relates to the Ionized Physical Vapor Deposition (IPVD) and, more particularly, to methods and apparatus by which coating material is supplied and ionized to improve the directionality of the coating material onto the substrates.

BACKGROUND OF THE INVENTION

Ionized physical vapor deposition is a process which has particular utility in filling and lining high aspect ratio structures on silicon wafers. In ionized physical vapor deposition (IPVD) for deposition of thin coatings on semiconductor wafers, materials to be deposited are sputtered or otherwise vaporized from a source and then a substantial fraction of the vaporized material is converted to positive ions before reaching the wafer to be coated. This ionization is accomplished by a high-density plasma which is generated in a process gas in a vacuum chamber. The plasma may be generated by magnetically coupling RF energy through an RF powered excitation coil into the vacuum of the processing chamber. The plasma so generated is concentrated in a region between the source and the wafer. Then electromagnetic forces are applied to the positive ions of coating material, such as by applying a negative bias on the wafer. Such a negative bias may either arise with the wafer electrically isolated by reason of the immersion of the wafer in a plasma or by the application of an RF voltage to the wafer. The bias causes ions of coating material to be accelerated toward the wafer so that an increased fraction of the coating material deposits onto the wafer at angles approximately normal to the wafer. This allows deposition of metal over wafer topography including in deep and narrow holes and trenches on the wafer surface, providing good coverage of the bottom and sidewalls of such topography.

Certain systems proposed by the assignee of the present application are disclosed in U.S. patent applications Ser. Nos. 08/844,757, 08/837,551 and 08/844,756 filed Apr. 21, 1997, and hereby expressly incorporated by reference herein. Such systems include a vacuum chamber which is typically cylindrical in shape and provided with part of its curved outer wall formed of a dielectric material or window. A helical electrically conducting coil is disposed outside the dielectric window and around and concentric with the chamber, with the axial extent of the coil being a significant part of the axial extent of the dielectric wall. In operation, the coil is energized from a supply of RF power through a suitable matching system. The dielectric window allows the energy from the coil to be coupled into the chamber while isolating the coil from direct contact with the plasma. The window is protected from metal coating material deposition by an arrangement of shields, typically formed of metal, which are capable of passing RF magnetic fields into the interior region of the chamber, while preventing deposition of metal onto the dielectric window that would tend to form conducting paths for circulating currents generated by these magnetic fields. Such currents are undesirable because they lead to ohmic heating and to reduction of the magnetic coupling of plasma excitation energy from the coils to the plasma. The purpose of this excitation energy is to generate high-density plasma in the interior region of the chamber. A reduction of coupling causes plasma densities to be reduced and process results to deteriorate.

In such IPVD systems, material is, for example, sputtered from a target, which is charged negatively with respect to the plasma, usually by means of a DC power supply. The target is often of a planar magnetron design incorporating a magnetic circuit or other magnet structure which confines a plasma over the target for sputtering the target. The material arrives at a wafer supported on a wafer support or table to which RF bias is typically applied by means of an RF power supply and matching network.

A somewhat different geometry employs a plasma generated by a coil placed internal to the vacuum chamber. Such a system does not require dielectric chamber walls nor special shields to protect the dielectric walls. Such a system is described by Barnes et al. in U.S. Pat. No. 5,178,739, expressly incorporated by reference herein. Systems with coils outside of the chamber as well as the system disclosed in the Barnes et al. patent involve the use of inductive coils or other coupling elements, either inside or external to the vacuum, that are physically positioned and occupy space between the planes of the sputtering target and the wafer.

Whether a coupling element such as a coil is provided inside or outside of a vacuum chamber, dimensions of the system have been constrained by the need for adequate source to substrate separation to allow for the installation of the RF energy coupling elements between the source and the substrate. Adequate diameter must also be available around the wafer for installation of coils or other coupling elements. As a direct result of the increased source to substrate spacing due to the need to allow space for the coupling element, it is difficult to achieve adequate uniformity of deposition with such systems. If the height of the chamber is reduced to improve uniformity there is a loss of plasma density in the central region of the chamber and the percentage ionization of the coating material is reduced. Also, in practice, the entire system must fit within a constrained radius. As a result, there are frequently problems due to heating arising from the proximity of the RF coils to metal surfaces, which may necessitate extra cooling, which increases engineering and production costs and wastes power.

An IPVD apparatus with the coil in the chamber has the additional disadvantage that the coils are eroded by the plasma and must therefore consist of target grade material of the same type as that being sputtered from the target.

Moreover, considerable cooling of coils placed in the vacuum chamber is needed. If liquid is used for this cooling of the coils, there is danger that the coils will be penetrated by uneven erosion or by arcing, causing a resulting leak of liquid into the system, which is highly undesirable and will likely result in a long period of cleaning and requalification of the system. Furthermore, an excitation coil in the chamber also couples capacitively to the plasma, leading to inefficient use of the excitation power and to the broadening of the ion energy spectrum, which may have undesirable effects on the process.

As a result of the above considerations and problems, there remains a need for more efficiently coupling energy into the dense coating material ionizing plasma in IPVD processing systems, and to do so without interfering with the optimum dimensions of the chamber and preferably without placing a coil or other coupling element into the vacuum chamber.

SUMMARY OF THE INVENTION

One objective of the present invention is to provide an IPVD method and an IPVD apparatus in which the placement of the coil or other coupling element does not adversely affect the geometry of the chamber of the processing apparatus. Another objective of the present invention is to provide a more efficient and effective method and apparatus for the performance of IPVD.

According to the principles of the present invention, an IPVD apparatus is provided with a ring-shaped source of coating material for producing a vapor that includes atoms or minute particles of the coating material to a processing space within a vacuum chamber. At the center of the ring-shaped source is provided a coupling element for reactively coupling RF energy into the chamber to produce a high density reactively coupled plasma in the processing space to ionize coating material passing through the processing space. The ions of coating material drift, whether under the influence of electrostatic or electromagnetic fields or otherwise, toward a substrate in the chamber, at the opposite end of the processing space from the source. Those ions that arrive within a certain distance, in the order of centimeter from the substrate for example, encounter a sheath field and are accelerated toward the substrate so that a high percentage of the coating material arrives on the substrate at angles normal to the substrate, thereby more effectively lining the bottoms and sides of, or filling, small and high aspect ratio features on the surface of the substrate.

In a preferred embodiment of the invention, a coating material source, preferably a sputtering target, is provided with a central opening in which is placed a dielectric window. Behind the window, outside the vacuum of the chamber, is located a plasma source which includes a coupling element, preferably a coil, which is connected to the output of an RF energy source. The coupling element is configured to couple, preferably inductively, energy supplied from the energy source through the window at the opening at the center of the material source and into the region of the chamber between the coating material source and the substrate, such as a semiconductor wafer, on a substrate support at the opposite end of the chamber from the coating material source.

Preferably, the apparatus of the present invention includes an annular sputtering target which surrounds a central ceramic window. In certain preferred embodiments, this annular cathode is flat or nearly flat. A magnetron magnet assembly is positioned behind the target to produce a plasma confining magnetic field over the target, preferably in the shape of an annular tunnel on the surface of the annular target surrounding the central opening at its center. The target is energized with a negative voltage, preferably a negative DC or pulsed DC voltage. A plasma is generated, which is generally confined to the tunnel, to sputter material from the target.

The coupling element is preferably a coil positioned behind and close to the back outside surface of the dielectric window at the central opening of an annular sputtering target. RF energy of, for example, 13.56 MHZ is applied to the coil to excite a high density inductively coupled plasma in the chamber between the target and the substrate. A main sputtering plasma that is trapped under the field of the magnetron magnets at the surface of the target sputters coating material from the target and into the region of the processing space occupied by the dense secondary plasma, where a substantial portion of the material is stripped of electrons to form positive ions of the coating material. A negative bias voltage is applied to a wafer on the substrate holder, which attracts the positive ions of sputtering material from the region of the secondary plasma and toward and onto the surface of the substrate, with the angles of incidence approaching being perpendicular to the substrate so that they can enter trenches and holes on the wafer substrate to coat the bottoms of these holes and trenches.

With apparatus structure according to the invention, the processing chamber can be dimensioned to provide optimum spacing between the coating material source and the substrate to provide both good ionization of sputtered species as well as good uniformity of deposition on the wafers.

The present invention provides greater freedom of design choice in configuring the processing chamber to optimize the IPVD process, and does so while overcoming the difficulties set forth in the background above.

These and other objectives and advantages of the present invention will be more readily apparent from the following detailed description of the drawings.

DETAILED DESCRIPTION OF THE INVENTION

Figure 1:
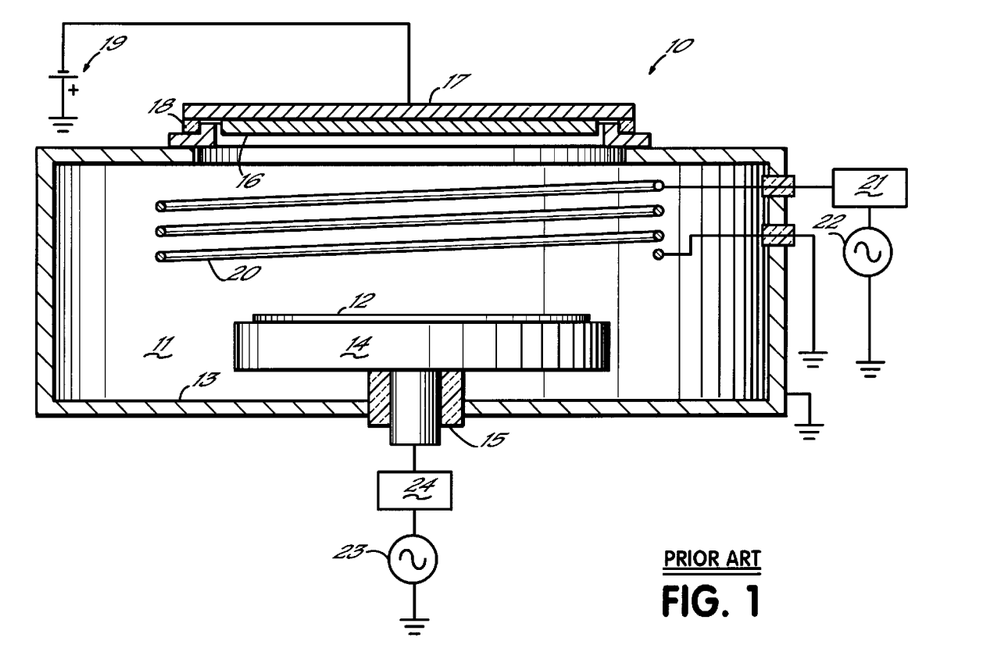
FIG. 1 is a cross-sectional diagram of one type of IPVD apparatus of the prior art.

An ionized physical vapor deposition apparatus 10 of the prior art is illustrated diagrammatically in FIG. 1. The apparatus 10 includes a sealed vacuum chamber 11 in which is supported a substrate such as a semiconductor wafer 12 for processing. The vacuum chamber 11 is bounded by a chamber wall 13 which is typically cylindrical in shape and normally formed from an electrically conductive metal and maintained at ground potential. The wafer 12 either rests upon or is clamped to a substrate or wafer support 14, which is supported by but electrically insulated from the chamber wall 13 by insulators 15. In the chamber 11 opposite the substrate support 14 is a sputtering target 16, which is mounted on a target holder or backing plate 17, which is schematically shown as mounted on an electrical insulator 18 in sealing relationship with the chamber wall 13. The target 16 is electrically connected to the output of a cathode power supply 19, which is illustrated as a DC source, which applies a negative electrical potential to the target 16. Behind the target 16, outside of the chamber 11 is typically provided a magnetron magnet package (not shown) which forms a plasma trapping magnetic field over the surface of the target 16 which confines a main plasma close to the surface of the target 16. Positive ions of processing gas, typically argon, within the chamber 11 that form in this main plasma are attracted to the surface of the target 16 where they dislodge or sputter from the target 16 atoms and other small particles of the coating material of which the target 16 is made. Normally, structure (not shown) is provided in the target holder 17 for communicating cooling fluid for the cooling of the target 16.

The IPVD apparatus 10 has a coil 20 internal to the vacuum chamber 11 between the substrate holder 14 and the target 16. The coil 20 is coupled through a suitable matching network 21 to the output of an RF generator 22. The coil 20 couples RF energy into the gas within the chamber 11 to form a plasma within the chamber 11. The purpose of this plasma energized by the RF energy is to form positive ions of the material that is sputtered from the target 16 as it passes through the region of the chamber 11 between the target 16 and the substrate 12 on the support 14. A bias energy source 23, which is typically an RF source, is coupled through a matching network 24 to the support 14 and the wafer 12 to generate a negative bias potential on the wafer 12.

In such an IPVD system 10, the location of the target 16 relative to the substrate 12 is constrained due to the presence of the RF coil 20 in the space between the target 16 and the wafer 12. As a direct result of the target to substrate spacing needed to allow for the coil 20, the uniformity of deposition onto the substrate 12 is compromised due to a lack of flexibility in positioning the target 16 relative to the substrate 12. Further, cooling within the coil 20 is typically required, which affects engineering and production costs and consumes power. The coil 20 of the apparatus 10 is in the chamber 11 and consequently is capable of being eroded by the plasma. The coil 20 therefore must be formed of the same target grade material as that of which the target 16 is formed. Further, cooling of such a coil 20 is provided usually by circulating water through the hollow interior (not shown) or the tube of which the coil 20 is formed.

Figure 2:
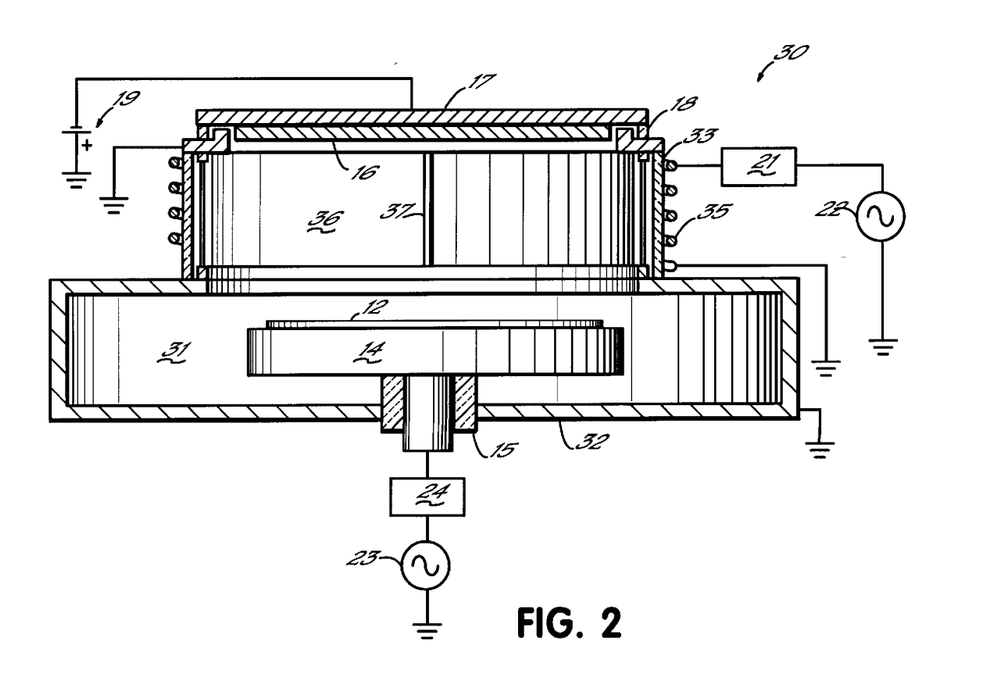
FIG. 2 is a cross-sectional diagram, similar to FIG. 1, illustrating a general type of IPVD apparatus proposed by the assignees of the present invention.

FIG. 2 illustrates an IPVD apparatus 30 which has a chamber 31 which is bounded by a chamber wall 32, which is typically cylindrical. In the chamber 31 is supported the substrate 12 on support 14, which is in turn supported by but electrically insulated from the chamber wall 32 by insulators 15. The chamber 31 is provided with part of its curved outer wall 32 formed of a dielectric material or window 33. In the chamber 31 opposite the substrate support 14 is a sputtering target 16, which is mounted on a target holder or backing plate 17 which is schematically shown as mounted on an electrical insulator 18 in sealing relationship with the chamber wall 32. The target 16 is electrically connected to the output of cathode power supply 19, which is illustrated as a DC or pulsed DC source, which applies a negative electrical potential to the target 16. Behind the target 16, outside of the chamber 31 is typically provided a magnetron magnet package (not shown) which forms a plasma trapping magnetic field over the surface of the target 16 which confines a main plasma close to the surface of the target 16. Positive ions of processing gas, typically argon, within the chamber 11, form in this main plasma and are attracted to the surface of the target 16 where they sputter from the target 16 atoms and other small particles of the coating material of which the target 16 is made.

A helical electrically conducting coil 35 is disposed outside the dielectric window 33 and concentric with the chamber 31, with the axial extent of the coil 35 being a significant part of the axial extent of the dielectric wall 33. In operation, the coil 35 is energized from RF power supply 22 through matching system 21. The dielectric window 33 allows energy from the coil 35 to be inductively coupled into the chamber 31 while isolating the coil 35 from direct contact with the plasma. The window 33 is protected from metal coating material sputtered from the target 16 by an arrangement of one or more shields 36, typically formed of metal, which are capable of passing RF magnetic fields into the interior region of the chamber 31, while preventing most such deposition of metal onto the dielectric window 33. The shield or shields 36 are either formed in electrically separate sections around the circumference of the chamber 31 or have at least one axial slit or gap 37 to interrupt circumferential current paths around the chamber 31 that would electrically shield or decouple the coil 35 from the plasma within the chamber 31. The RF energy coupled by the coil 35 into the chamber 31 produces a dense plasma in the chamber 31 so that a substantial portion of the material sputtered from the target 16 passes through the chamber 31 will become positively ionized.

A negative bias is applied to the substrate 12 from RF source 23 through matching network 24 to electrostatically attract and steer positive ions of sputtering material from the plasma onto the substrate 12 in a direction nearly perpendicular to the substrate 12. The bias energy source 23 employs RF energy or other form of electrical energy that is effective to cause a potential to develop on the substrate that is sufficiently negative relative to the potential of the plasma to attract positive ions of sputtered material from the plasma toward the substrate 12 so that they preferably impinge upon the substrate 12 at or nearly at right angles to the surface, thereby enabling the coating of the bottoms of high aspect ratio features on the substrate 12. The bias potential on the substrate 12 should not be so high as to attract the ions onto the substrate at energies that are high enough to substantially etch or otherwise damage the films or the devices being formed on the substrate 12.

Figure 3:
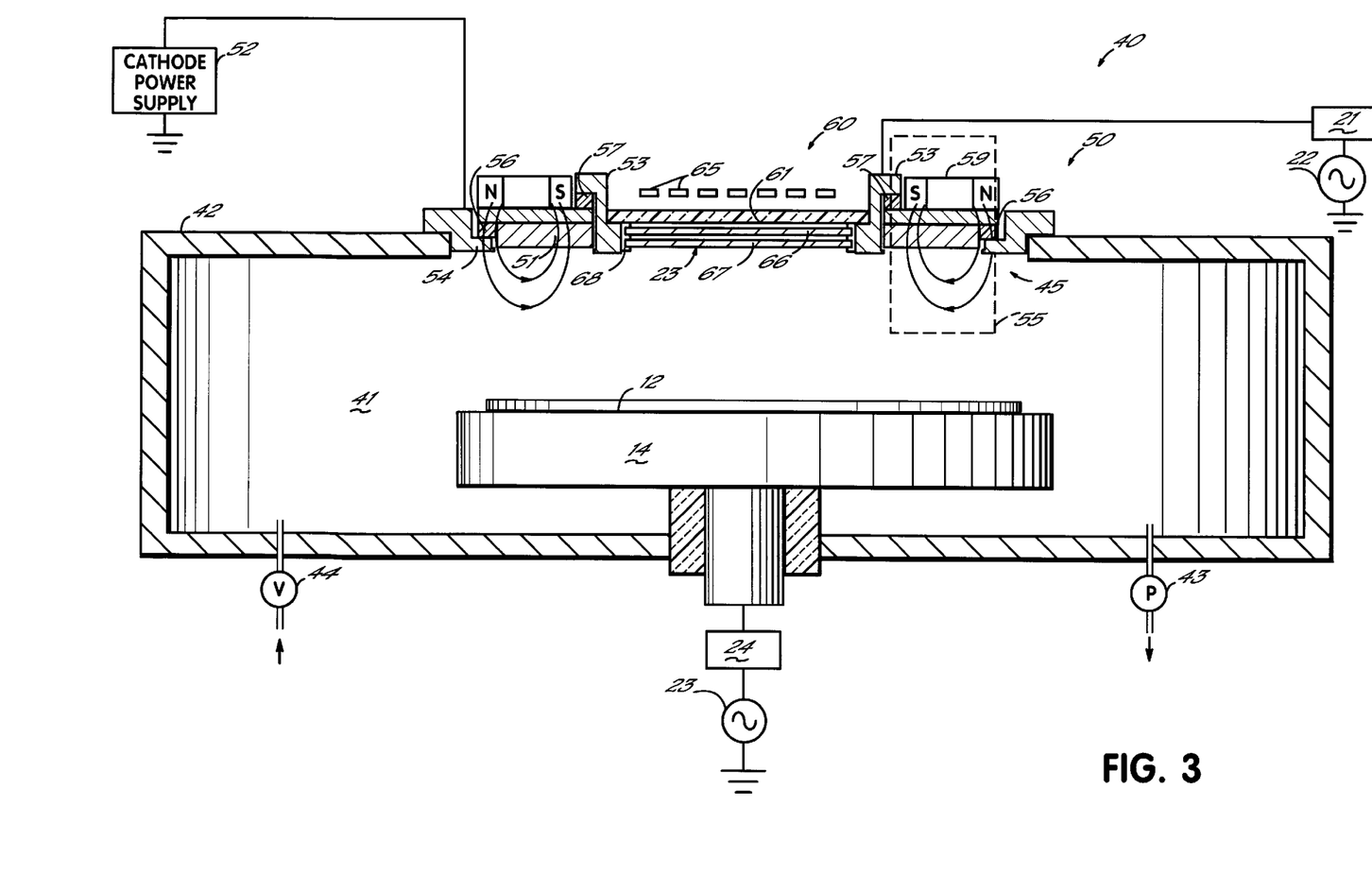
FIG. 3 is a cross-sectional diagram, similar to FIG. 2, illustrating an IPVD apparatus according to one preferred embodiment of the present invention.

An IPVD sputtering apparatus 40 according to a preferred embodiment of the present invention is illustrated in FIG. 3. The IPVD apparatus 40 includes a vacuum chamber 41 bounded by a chamber wall 42. The chamber 41 is provided with a vacuum pumping system 43 for evacuation of the chamber 41 to high vacuum; a system for loading and unloading wafers for processing (not shown), wafer holder 14 with provision 23,24 for application of RF-generated negative bias, a system 44 for supplying inert gases and reactive gases for use in reactive sputtering applications, and a large opening 45 at the opposite end of the chamber 41 from the wafer support or holder 14. This opening 45 is sealed by a source arrangement or cathode and electrode assembly 50.

The support 14 is preferably adjustably spaced relative to a target so that the target to substrate spacing can be adjusted during the life of the target 1 to maintain desired uniformity. Where such an adjustable support is provided, a seal in the form of a metal bellows (not shown), for example, may be provided between the support 14 and the wall 42 of the chamber 41. The geometry of the chamber 41, particularly the location of the side walls of the chamber wall 42 with respect to the wafer edges, has an effect on the uniformity of the deposition, particularly where the wall 42 is close to the wafer, and accordingly, the geometry of the chamber must be empirically considered in relation to other parameters of the process to optimize deposition uniformity.

As shown In FIG. 3, the assembly 50 includes a generally annular target 51 which, in operation, is charged negatively by a cathode power supply 52, which is preferably in the form of either a DC or pulsed DC power supply, or may be in the form of an RF supply connected to the target 51 through a suitable matching network. The erosion of the target 51 is controlled by inner and outer dark space rings 53,54 and preferably also by magnetic fields generated by a magnetron magnet assembly 59 as schematically shown in the region 55. Cooling of the target 51 is achieved by the use of internal water channels (not shown) or by immersion in a suitable external cooling system (not shown), which are conventional. The target 51 is electrically isolated from grounded surfaces by the insulators 56,57. The annular target 51 has an inner opening 58 in which is mounted an RF plasma excitation system 60.

The RF excitation system 60 may be implemented in a number of ways. One preferred embodiment is that illustrated in FIG. 3 and FIG. 4. The plasma excitation system 60 includes a plane dielectric window 61 which seals the opening 58 of the annular target 51. The side of the window 61 that is facing the substrate 12 is in contact with the vacuum of the chamber 41 while the opposite side or outer face of the window 61 is in contact with a nominally atmospheric environment. Near the outer face of the window 61 is an excitation coil 65 which preferably extends in a direction parallel to the window and may be planar or substantially planar. One suitable coil 65 is, for example, that described in U.S. Pat. No. 4,948,458 granted to Ogle or in U.S. Pat. No. 5,669,975 granted to Ashtiani, both expressly incorporated by reference herein. On the interior side of the window 61 is a plurality of shields 66, 67, which serve as physical shields to protect the dielectric window 61 from deposition of sputtered metal or other sputtered material while also serving as Faraday shields that allow the passage of inductively coupled RF energy from the coil 65 into the chamber 41. The shields 66,67 are mounted a small distance apart and close to the inside surface of the dielectric window 61. The shields 66,67 are preferably slotted and may be electrically grounded to, and maintained in good thermal contact with, the dark space shield 53, which is preferably water cooled. Alternatively, one or both of the shields 66,67 may be electrically floating, at least with respect to RF energy on the coil 65. In the preferred embodiment, the shields 66,67 are cooled by conduction from the edges, either to the dark space shield 53 which is water-cooled, or through an optional electrically insulating and thermally conductive supporting ring 68 that would allow cooling of the shields 66,67 while electrically insulating the shields 66,67 from the dark space shield 53, if desired. Other shield cooling techniques and arrangements of shields can be employed.

Figure 4:
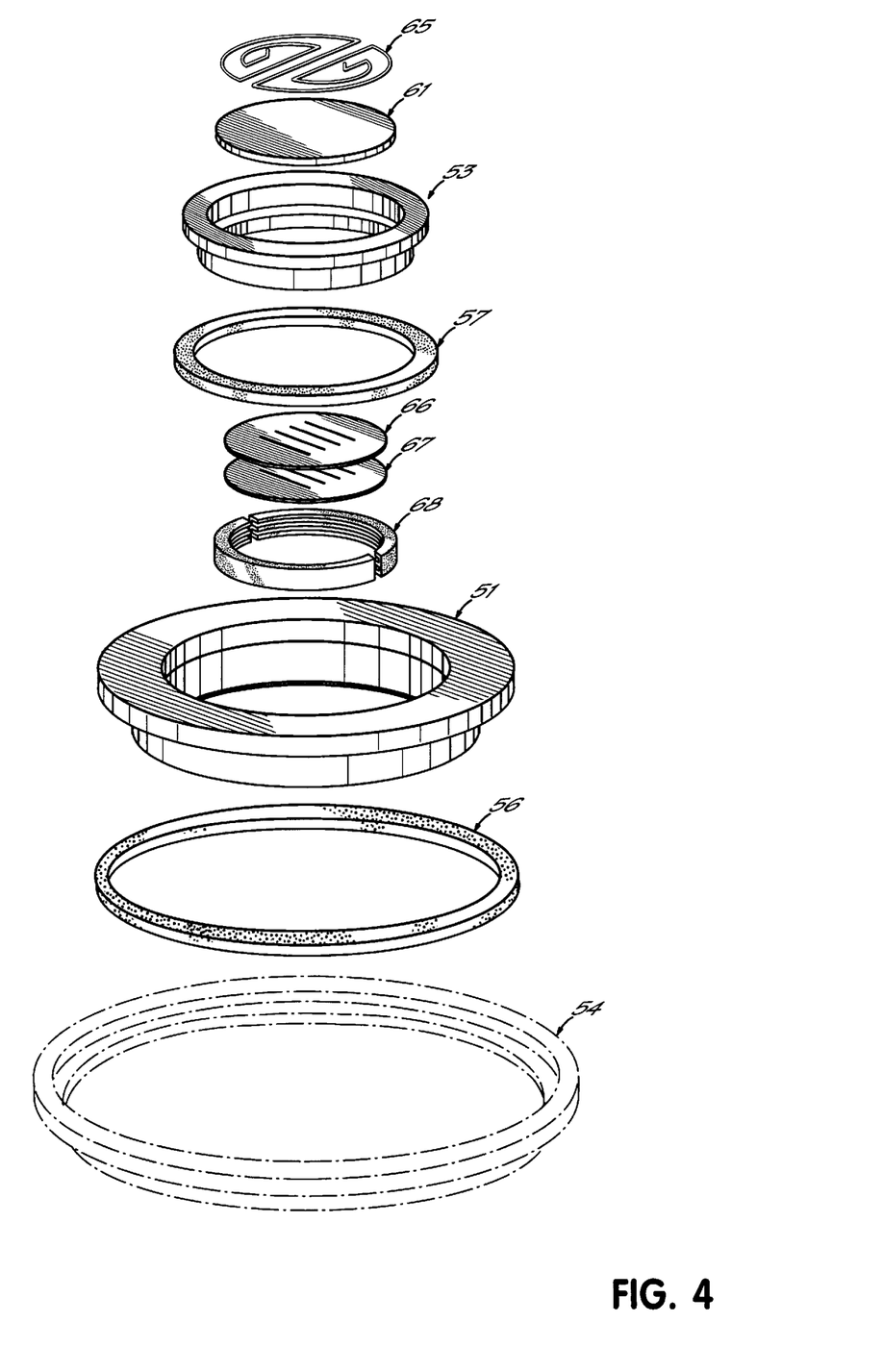
FIG. 4 is a disassembled perspective view of the cathode and electrode assembly of FIG. 3.

In operation, a RF voltage is supplied by the power supply 22 through matching network 21 to the excitation coil 65. Techniques for design of the matching unit and certain connections so as to minimize undesirable capacitive coupling to the shields 66,67 are described in U.S. Pat. No. 5,669,975 to Ashtiani. Process gases are supplied to raise the pressure in the chamber to about 1 to 40 mTorr. A high-density plasma can then be ignited in the chamber. DC or RF power is supplied to the sputtering target 51, which is eroded by ion bombardment from the main plasma. The material sputtered from the target by the main plasma is ionized as it passes through the high density plasma supported by the inductively coupled energy from the coil 65. This ionized sputtered coating material is accelerated towards the wafer 12 which is negatively biased as set forth in connection with the apparatus 30 of FIG. 2.

Figure 5:
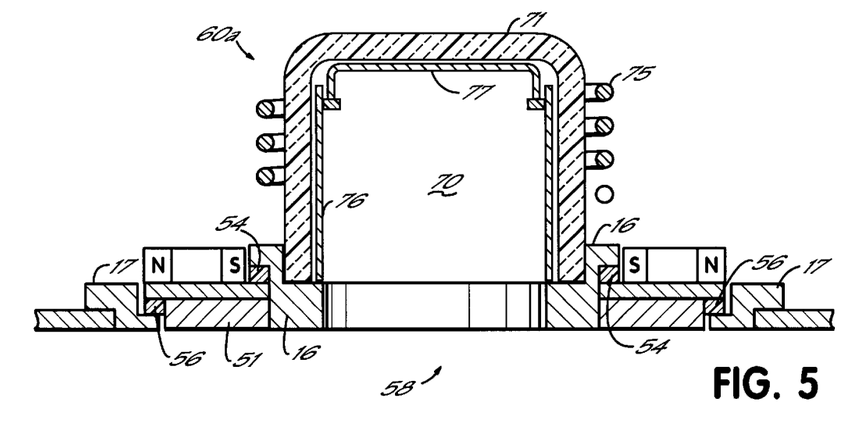
FIG. 5 is a cross-sectional view illustrating an alternative cathode and electrode assembly to that illustrated in the IPVD apparatus of FIG. 3.

Illustrated in FIG. 5 is an embodiment of the apparatus 40 in which an alternative plasma excitation system 60a is provided that includes a well or chamber recess 70 located in the inner opening 58 at the center of the annular target 51. The recess 70 is bounded by a wall 71 of quartz or other suitable dielectric material, behind which, outside of the vacuum of the chamber 41 and concentric with the window 71, is wound a helical coil 75. Suitable Faraday shields 76,77 are positioned adjacent the window 71, which also function as physical shields to protect the dielectric material from deposition while allowing the passage of RF energy from the coil 75 into the volume of the well 70 from which it will propagate throughout the processing space. The shields 76,77 provide the physical shielding and RF transmission functions similar to those of shields 66,67 described in connection with FIG. 2 and may include features such as those disclosed in U.S. patent applications Ser. Nos. 08/844, 757, 08/837,551 and 08/844,756, which are incorporated by reference herein. In operation, the helical coil 75 is energized with high frequency RF energy and high-density plasma is generated in the region of the well 70 within the vacuum of the chamber 41. The high density plasma streams into the main process area of the chamber 41 where ionization of material that is sputtered from the target 51 occurs.

Figure 6:
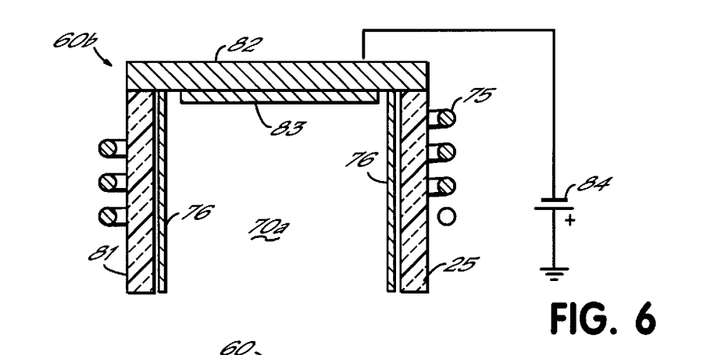
FIG. 6 is a cross-sectional view, similar to FIG. 5, illustrating a further alternative cathode electrode assembly.

Alternatively, as illustrated in FIG. 6, the apparatus 40 is provided with a plasma excitation system 60b, similar to the system 60 of FIG. 5, but having a well 70a at the center of the target 51 surrounded by a cylindrical quartz wall 81 with a removable auxiliary cathode assembly 82 sealed at the remote end of the wall 81. On the cathode assembly 82 is mounted a small planar auxiliary target 83, which is made of the same material as the annular target 51. A magnetron assembly (not shown) is preferably provided behind the target 83. This auxiliary target 83 is energized by an auxiliary DC power supply 84. The purpose of this target 83 is to supply an additional optional source of sputtering material in order to provide more uniform deposition of the sputtering material on the substrate where appropriate.

Figure 7:
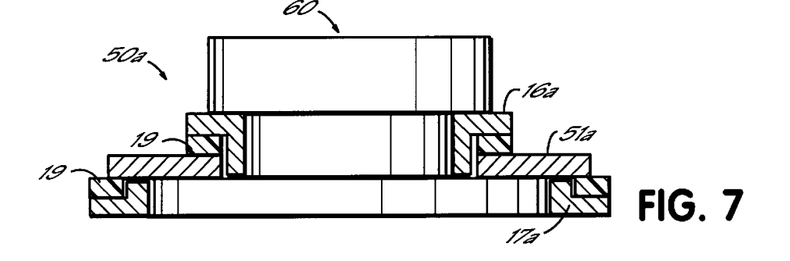
FIG. 7 is a cross-sectional view, similar to FIG. 5 illustrating another alternative cathode and electrode assembly.
Figure 8:
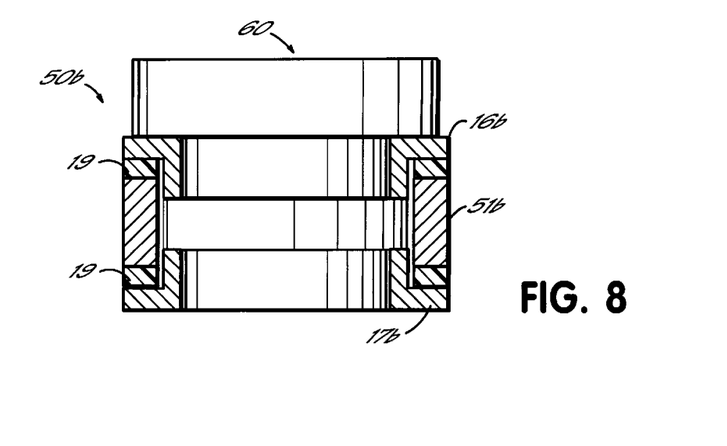
FIG. 8 is a cross-sectional view, similar to FIG. 7, illustrating a still further alternative cathode and electrode assembly.
Figure 9:
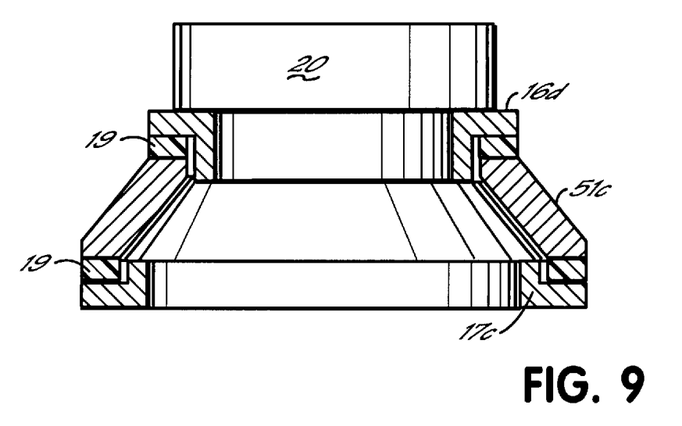
FIG. 9 is a cross-sectional view, similar to FIG. 7, illustrating a still further alternative cathode and electrode assembly.

The main annular sputtering target 51 of the cathode and electrode assembly 50 may be provided in a number of alternative configurations as shown in FIGS. 7–9. In FIG. 7, the target of alternative assembly 50a is provided in the form of a flat annular target 51a between appropriately configured inner and outer dark space shields 16a, 17a, while in FIG. 8, the target of a further alternative cathode and electrode assembly 50b is provided in the form of a cylindrical target 51b. In FIG. 9, a further alternative cathode and electrode assembly 50c includes a target 51c in the form of a truncated cone. The selection of target geometry can be made to affect a desired balance between ionization and optimum utilization of the target material. The geometry target 51b of FIG. 8, for example, tends to cause material to be emitted from the sputtering target 51b toward the highest density region of the plasma, which leads to efficient ionization of the sputtered material, with less of the sputtered material then arriving at the wafer.

An advantage of locating the plasma excitation system at an opening in the center of an annular target or other ring-shaped source is that dimensional constraints imposed by the need to interpose helical coils concentrically around an axis between the center of the sputtering source and the center of the wafer are eliminated. A further advantage is that benefits arise from the use of the annular target or ring-like source, which enhances film uniformity at a greater target to wafer separation than in the case of a flat solid planar source. The ability to achieve uniformity at greater target to substrate distance allows more opportunity for ionization of the sputtered material. When ring-shaped sources have been used with sputter coating devices of the prior art, such devices usually required special shielding in the central region of the source to prevent the redeposition of sputtered material at this region. In such a case, heating of this central region often was necessary to ensure good adhesion of this material and to prevent flaking off of the deposited material, which would increase particulate contamination of the chamber. In embodiments of the present invention, the central opening of the ring-shaped source is used as a location for equipment used to excite a high density plasma and so becomes a useful part of the system rather than a liability by contributing to the ionization of sputtered material for directional deposition onto the substrate.

A further advantage arising from various embodiments of the present invention is that the cathode and the secondary plasma exciting structure can be made more compact than in the prior art and does not require extra feed-through or other modifications to the process vacuum chamber, making it practical to fit the source to existing modules.

Those skilled in the art will appreciate that the implementation of the present invention herein can be varied, and that the invention is described in preferred embodiments. Accordingly, additions and modifications can be made without departing from the principles and intentions of the invention.

What is claimed is:

1. An ionized physical vapor deposition apparatus comprising:

a vacuum chamber having a chamber wall surrounding a vacuum processing space inside of the chamber;

a ring-shaped source of electrically conductive coating material from which electrically conductive coating material is supplied to the processing space, the ring-shaped source having a central opening and at least one surface in communication with the vacuum processing space;

a substrate support inside of the chamber opposite the processing space from the ring-shaped source;

the chamber wall including a dielectric window in the central opening of the ring shaped source;

an RF energy source outside of the chamber;

a coil outside of the chamber adjacent the dielectric window and connected to the RF energy source to inductively couple energy through the window and into the chamber to form an inductively coupled plasma in the processing space that is sufficiently dense to ionize electrically conductive coating material moving from the ring-shaped source through the processing space; and a shield structure inside of the window between the window and the processing space, the shield being configured to reduce capacitive coupling of RF energy therethrough and to permit an effective substantially inductive coupling of RF energy from the coil into the processing space and to physically shield the dielectric window from electrically conductive coating material from the processing space.

2. The apparatus of claim 1 further comprising:

a bias power supply connected to the substrate support so as to produce a DC potential on a substrate on the support that is sufficiently negative relative to the plasma to direct positive ions of electrically conductive coating material from the processing space toward the substrate.

3. The apparatus of claim 1 wherein:

the ring-shaped source includes at least one annular sputtering target of electrically conductive coating material having a sputtering surface in communication with the inside of the chamber and a target power supply connected to the target to supply a DC potential to the sputtering surface that is sufficiently electrically negative relative to the plasma to sputter material from the sputtering surface of the target into the processing space.

4. The apparatus of claim 3 further comprising:

a magnetron magnet behind the target outside of the chamber effective to confine a sputtering plasma in close proximity to the sputtering surface of the target.

5. The apparatus of claim 3 wherein:

the ring-shaped source includes at least one flat annular sputtering target having a sputtering surface lying approximately in a plane that is substantially parallel to a substrate on the support.

6. The apparatus of claim 1 wherein:

the ring-shaped source includes at least one cylindrical sputtering target having a sputtering surface that is generally perpendicular to a substrate on the support.

7. The apparatus of claim 1 wherein:

the ring-shaped source includes at least one frusto-conical sputtering target having a sputtering surface facing a substrate on the support at an angle to the surface of the substrate.

8. The apparatus of claim 1 wherein:

the dielectric window is a generally planar window lying within the central opening of the ring-shaped source; and the coil is a substantially flat coil situated behind and substantially parallel to the window.

9. The apparatus of claim 1 wherein:

the coil has conductor portions that are substantially flat and situated behind and substantially parallel to the window; and the shield structure includes a slotted sheet of electrically conductive material having a high RF impedance to ground and having slots therein substantially parallel to the conductor portions of the coil that are substantially parallel to the window.

10. The apparatus of claim 1 wherein:

the dielectric window is a generally well-shaped window having a cylindrical side wall and a closed end, the window being within the central opening of the ring-shaped source and forming a recess communicating with the processing space;

the coil is a helical coil surrounding the cylindrical wall of the window; and the shield structure includes a cylindrical arrangement of one or more sheets of electrically conductive material physically shielding the cylindrical wall from material moving from the processing space.

11. The apparatus of claim 1 wherein:

the dielectric window is a generally cylindrical window within the central opening of the ring-shaped source and forming a recess communicating with the processing space, the recess having a closed end;

the coil is a helical coil surrounding the cylindrical window;

the shield structure includes a cylindrical arrangement of one or more sheets of electrically conductive material physically shielding the cylindrical wall from material moving from the processing space; and the apparatus further comprises a supplemental target situated at the closed end of the recess.

12. An ionized physical vapor deposition apparatus comprising:

a vacuum chamber having a chamber wall surrounding a vacuum processing space inside of the chamber;

a substrate support in the chamber at one end of the processing space;

an annular sputtering target of electrically conductive coating material opposite the processing space from the substrate support and having a central opening therein and a substantially flat ring-shaped sputtering surface facing the substrate support;

the chamber wall including a dielectric window proximate the central opening of the annular target;

a target power supply connected to the target to supply a potential to the sputtering surface that is sufficient to produce a sputtering plasma to sputter material from the sputtering surface of the target into the processing space and toward the substrate support;

an RF energy source outside the chamber;

an RF coil proximate the central opening and connected to the RF energy source to inductively couple energy into the processing space to form an inductively coupled plasma in the processing space that is sufficiently dense to ionize electrically conductive coating material from the annular target in the processing space;

a Faraday shield structure inside of the window between the window and the processing space and configured to permit the effective inductive coupling of RF energy from the coil into the processing space while impeding the capacitive coupling of RF energy from the coil into the processing space, and to physically shield the window from electrically conductive coating material from the processing space; and the substrate support being equipped, when energized by the target power supply, to apply potential to a substrate on the support that is sufficiently negative relative to the plasma to direct positive ions of electrically conductive coating material from the processing space toward the substrate without damaging the substrate.

13. The apparatus of claim 12 wherein:

the coil has conductors adjacent the window that are substantially parallel to the window; and the shield structure has slots therein configured to impede the capacitive coupling and to permit the effective inductive coupling of RF energy from the coil into the processing space.

14. The apparatus of claim 13 wherein:

the dielectric window is a generally planar window lying within the central opening of the annular target; and the coil is a flat coil situated behind and parallel to the window.

15. The apparatus of claim 13 wherein:

the shield structure includes a slotted sheet of conductive material having a high RF impedance to ground.

16. The apparatus of claim 13 wherein:

the dielectric window is a generally bell-shaped window having a cylindrical side wall and a closed end, the window being within the central opening of the annular target and forming a recess communicating with the processing space;

the coil is a helical coil surrounding the cylindrical wall of the window; and the shield structure includes a cylindrical arrangement of one or more sheets of conductive material physically shielding the cylindrical wall from material moving from the processing space.

17. The apparatus of claim 13 wherein:

the dielectric window is a generally cylindrical window side wall within the central opening of the annular target and forming a recess communicating with the processing space, the recess having a closed end;

the coil is a helical coil surrounding the cylindrical window;

the shield structure includes a cylindrical arrangement of one or more sheets of conductive material physically shielding the cylindrical wall from material moving from the processing space; and the apparatus further comprises a supplemental target situated at the closed end of the recess.

18. The apparatus of claim 12 wherein:

the RF electrode includes a coil situated at the central opening of the target and connected to the RF energy source to inductively couple energy into the processing space to form an inductively coupled plasma in the processing space that is sufficiently dense to ionize coating material from the annular target in the processing space; and the apparatus further comprises:

a dielectric window proximate the central opening of the annular target and positioned to isolate the coil from the processing space, and a shield structure inside of the window between the window and the processing space and configured to permit the effective coupling of RF energy from the coil into the processing space and to physically shield the window from coating material from the processing space.

19. The apparatus of claim 12 wherein:

the RF electrode includes a coil situated at the central opening of the target and connected to the RF energy source to inductively couple energy into the processing space to form an inductively coupled plasma in the processing space that is sufficiently dense to ionize coating material from the annular target in the processing space; and the apparatus further comprises a dielectric window proximate the central opening of the annular target and positioned to isolate the coil from the processing space.

20. The apparatus of claim 19 wherein the coil is positioned outside of the chamber opposite the dielectric window from the processing space to inductively reactively couple energy into the processing space through the dielectric window.

21. The apparatus of claim 20 wherein the apparatus further comprises a shield structure inside of the window between the window and the processing space and configured to effectively permit the coupling of RF energy from the coil into the processing space and to physically shield the window from coating material from the processing space.

22. The apparatus of claim 21 further comprising:

a magnetron magnet assembly behind the target outside of the chamber effective to generate a magnetic field around the substantially flat ring-shaped sputtering surface and surrounding the central opening of the target so as to confine a sputtering plasma in close proximity to the sputtering surface of the target.

23. The apparatus of claim 12 further comprising:

a magnetron magnet assembly behind the target outside of the chamber effective to generate a magnetic field around the substantially flat ring-shaped sputtering surface and surrounding the central opening of the target so as to confine a sputtering plasma in close proximity to the sputtering surface of the target.

24. An ionized physical vapor deposition method comprising the steps of:

a ring of electrically conductive coating material having a center and located at one end of a processing space in a vacuum processing chamber, releasing particles of the material into the processing space;

inductively coupling RF energy from a coil outside the chamber into the processing space through an opening in the electrically conductive coating material at the center of the ring of electrically conductive coating material;

physically shielding the window from deposits by electrically conductive coating material with a Faraday shield configured to reduce capacitive coupling of RF energy from the coil while effectively permitting substantially inductive coupling of RF energy from the coil into the processing space;

with the coupled RF energy, forming an inductively coupled plasma in the processing space that is sufficiently dense to ionize a substantial fraction of the electrically conductive coating material in the processing space; and electrically biasing a substrate at the end of the processing space opposite the ring of electrically conductive coating material to produce a DC potential thereon that is sufficiently negative relative to the plasma to direct positive ions of the electrically conductive coating material from the processing space toward the substrate at approximately normal angles thereto.

25. The method of claim 24 wherein the particle releasing step includes the steps of:

providing an annular sputtering target of electrically conductive coating material having a sputtering surface thereon surrounding the opening in the electrically conductive coating material opposite the processing space from a substrate support;

energizing the target with a target power supply to supply a DC potential to the sputtering surface that is sufficiently negative relative to plasma to sputter material from the sputtering surface of the target into the processing space and toward the substrate support; and generating a magnetic field over the sputtering surface of the target and surrounding the opening in the electrically conductive coating material, and confining a sputtering plasma in close proximity to the sputtering surface of the target.

26. The method of claim 24 wherein the RF energy coupling and plasma forming steps include the steps of:

the coupling step includes the step of providing a coil outside of the chamber having conductors adjacent the window that are substantially parallel to the window;

inductively coupling energy from the coil through a window at the center ring of coating material and into the processing space; and the shielding step includes the step of physically shielding the window from deposits by coating material while effectively permitting the substantially inductive coupling of RF energy from the coil into the processing space with a Faraday shield having slots therein substantially perpendicular to the conductors of the coil adjacent the window.

27. The method of claim 24 wherein further comprising the step of:

forming an electrically conductive film on a substrate by directing the ions of electrically conductive coating material thereon.

* * * * *

UNITED STATES PATENT AND TRADEMARK OFFICE
CERTIFICATE OF CORRECTION

PATENT NO. : 6,080,287
DATED : June 27, 2000
INVENTOR(S) : Drewery et al.

It is certified that error appears in the above-identified patent and that said Letters Patent is hereby corrected as shown below:

<u>Column 6,</u>
Line 50, after "target", delete "1".

<u>Column 9,</u>
Line 58, delete "DC".

<u>Column 10,</u>
Line 36, delete "having a high RF impedance to ground and".
Line 42, delete "is a generally well-shaped window having" and insert therefor -- has --.

<u>Column 11,</u>
Line 34, delete ", when energized by the target power supply,"; and
Line 35, insert -- a -- after "apply".
Line 55, delete "having a high RF impedance to ground", and insert therefor -- and is electrically floating with respect to RF energy on the coil --.
Line 57, delete "is a generally bell-shaped window having", and insert therefor -- has --.

<u>Column 13,</u>
Line 5, before "a ring", insert -- from --; and before "from a ring", insert -- releasing particles of the material into the processing space --; and
Lines 7-8, delete "releasing particles of the material into the processing space"; and
Line 10, after "through", insert -- a window in --; and
Line 28, before "potential", delete "DC".

UNITED STATES PATENT AND TRADEMARK OFFICE
CERTIFICATE OF CORRECTION

PATENT NO.    : 6,080,287
DATED         : June 27, 2000
INVENTOR(S)   : Drewery et al.

It is certified that error appears in the above-identified patent and that said Letters Patent is hereby corrected as shown below:

Column 14,
Lines 19-22, delete "inductively coupling energy from the coil through a window at the center ring of coating material and into the processing space".
Line 30, before "further comprising", delete "wherein".

Signed and Sealed this

Eighth Day of April, 2003

JAMES E. ROGAN
*Director of the United States Patent and Trademark Office*